April 16, 1957 J. C. ACHENBACH ET AL 2,789,212

TWO-BAND TUNER WITH STATOR CARRIED COIL INDUCTORS AND ROTOR CARRIED STRIP INDUCTOR

Filed June 12, 1953

INVENTORS
John C. Achenbach &
Philip C. Smierczak

BY H. D. Newton

ATTORNEY

United States Patent Office 2,789,212

Patented Apr. 16, 1957

2,789,212

TWO-BAND TUNER WITH STATOR CARRIED COIL INDUCTORS AND ROTOR CARRIED STRIP INDUCTOR

John C. Achenbach, Haddonfield, and Philip C. Swierczak, Pennsauken, N. J., assignors to Radio Corporation of America, a corporation of Delaware Application June 12, 1953, Serial No. 361,134

13 Claims. (Cl. 250—20)

Figures 1, 2, 3, 4:
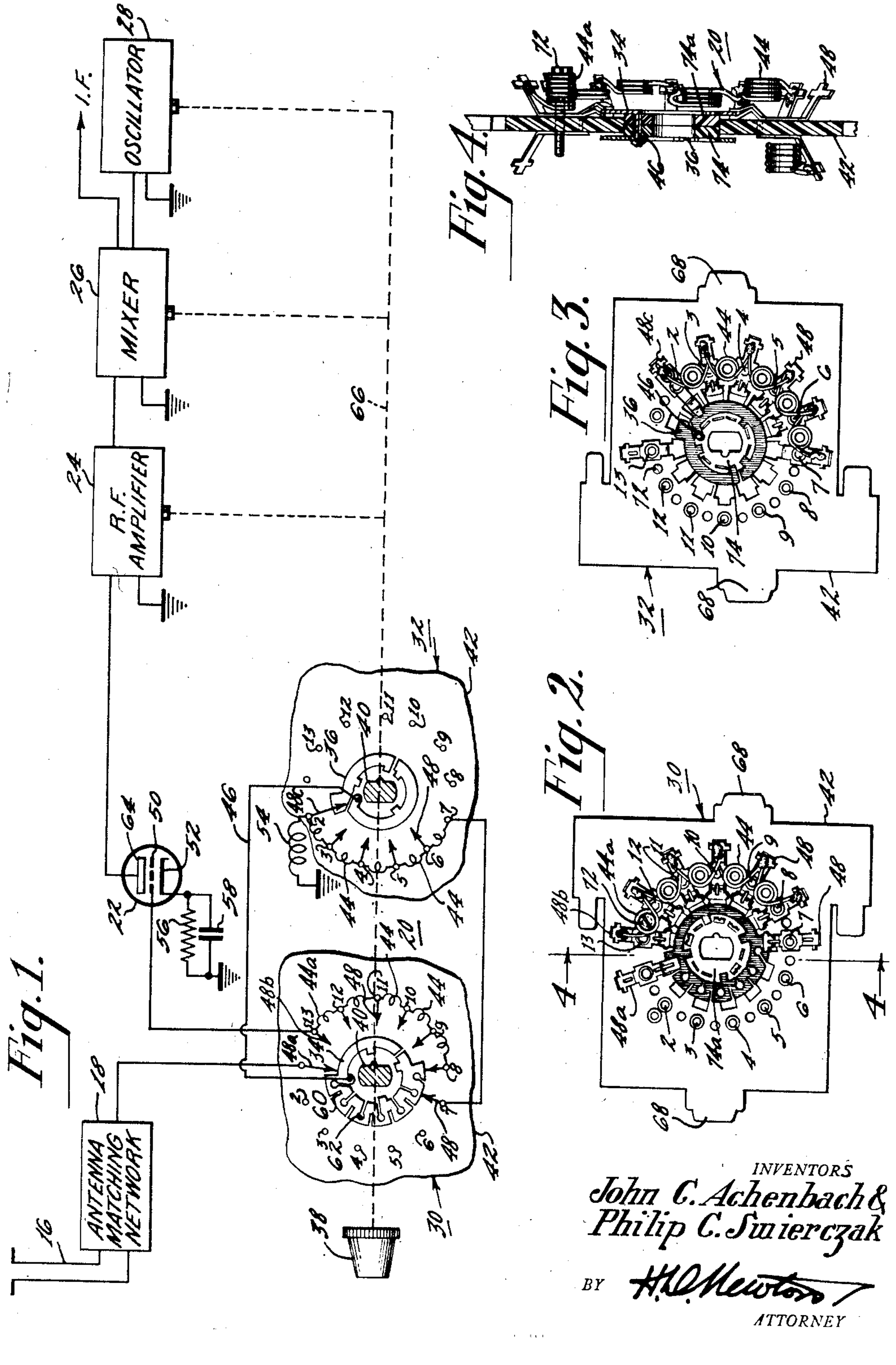

This invention relates to tuning means for high frequency and television signal receiving systems and the like, and in particular to channel selector switching devices and circuits for tuning such systems over a wide range of signal frequencies.

Television receivers presently operate in the very high frequency (VHF) bands extending from 54 to 88 megacycles (mc.) and from 174 to 216 megacycles, accommodating television channels 2 to 6 and 7 to 13 respectively. In one of the known and commercially practical tuning systems for such receivers, rotary switches are arranged to connect various tuning elements, such as inductors, selectively into circuit with the radio frequency amplifier, mixer and oscillator stages thereof. The switches have a number of positions and provide circuit connections with the tuning elements for selective response in each of the signal channels that may be received. In this manner a step tuning system as distinguished from continuous tuning through a wide frequency range, is provided to cover the various channels in two bands of operating frequencies.

Generally rotary switches which are utilized for tuning purposes as above, comprise an annular stator element and a rotor element therein. The stator element may have a plurality of circumferentially spaced terminals. Suitable tuning inductors are provided for the stator element and connected in series relation with and along these terminals. Electrical contacts from all or certain of the terminals are arranged selectively to cooperate with the rotor element in providing selection of the tuning inductors. The position of the rotor element thus determines the number of inductors or total inductance in circuit between portions of the receiver circuit to establish the desired channel response.

The tuning inductance elements or inductors for operating in the VHF bands are very small in inductance value and size, and for this reason may be of very few turns or even a single turn, thereby making the construction of the rotary switch and inductor units a painstaking procedure. The ease and economy with which such units may be constructed are also dependent on the number of contacts needed. Accordingly, it is desirable to minimize both the number of inductors or inductance coils and switch contacts, without however, sacrificing a constant band-pass characteristic in the tuning response at the various signal frequencies.

It is, therefore, an object of the present invention to provide an improved high frequency tuner of the rotary selector switch type having a minimum number of inductance and switch elements, for more efficient operation and low cost.

It is a further object of the present invention to provide an improved high frequency tuner of the type employing rotary switches for signal selection in a plurality of channels, wherein the number of switch contacts is minimized for a given number of channels to be selected.

It is still another object of the present invention to provide an improved high frequency multiple-band tuner of relatively low cost and simplified construction which provides substantially constant band-pass through its tunable range of frequency bands.

These and further objects of the present invention are achieved by providing an improved rotary switch tuning device of the aforementioned type in which conductive rotor elements and co-axial insulated stator elements are provided with switch contacts for associated tuning inductor elements, and portions of one of the rotor elements are utilized as inductance means which may be varied by changing the electrical length of the conductive path through said rotor element. A specific application of the invention is in the form of an improved rotary switch tuning device to couple the signal input circuit of a television tuner to a first high frequency (R.-F.) amplifying stage.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a schematic circuit diagram, partly in block form, of a high frequency signal tuning system for a television receiver embodying the present invention;

Figures 2 and 3 are front and rear elevational views, respectively, of rotary switch tuning means for the system shown in Figure 1, constructed in accordance with the invention; and Figure 4 is an enlarged cross-sectional view, taken on lines 4—4 of Figure 2, showing further details of the rotary switch tuning means of Figures 2 and 3.

Referring to the drawing wherein like elements are designated by like reference numerals throughout, and with particular reference to Figure 1, the radio frequency (R.-F.) section of a television receiver represented therein includes a signal receiving antenna 16, an antenna matching network 18, a rotary switch tuning system 20, a first R.-F. amplifier 22, a second R.-F. amplifier 24, a signal mixer 26, and a local oscillator 28, operative in accordance with conventional superheterodyne principles. The intermediate frequency (I.-F.) signal is taken from the mixer 26 and is applied to the usual I.-F. amplifier (not shown) of the receiver.

The antenna matching network 18 provides a suitable impedance matching condition between the antenna and the input circuit of the receiver, which in this case is the input or grid circuit of the R.-F. amplifier 22. This network may also have a suitable high pass filter configuration with a cut-off frequency just below the frequency of the lowest frequency television signal to be received. The network 18 may also be tunable in accordance with well known principles.

The rotary switch tuning means 20 comprises two switch and tuning sections indicated generally at 30 and 32. Each section includes a conductive rotor element 34 and 36, respectively. The rotor elements 34 and 36 are insulated from each other and mechanically connected by a shaft 40 for simultaneous rotation in the same direction around a common axis in response to rotation of a control knob 38 which is connected with the shaft 40 as indicated.

The rotor elements may be disposed for rotation on opposite sides of an insulating stator element 42. In this connection it should be understood that the opposite sides of the stator element have been illustrated as being two separated elements in Figure 1 for purposes of explaining the invention, although in practice the stator is preferably a single unitary element. A plurality of stator terminals (2 to 13) are circumferentially disposed about each of the rotor elements 34 and 36. The various positions the rotor elements assume as they are rotated correspond to the different television channels, as will be hereinafter explained.

The tuning inductors or coils 44 are on each side of the stator and may be five in number for each of the rotor elements or a total of ten in the present example. These inductors may be small spiral-wound coils and are connected in series along the stator element to the terminals 8 through 13 inclusive for the switch section 30 and to the terminals 2 through 7 inclusive for the switch section 32, the terminals being connected with the coil junctions. Electrical contacts 48 are provided extending from the terminals 7 through 13 inclusive for switch section 30 and terminals 2 through 6 inclusive for switch section 32.

In accordance with the present invention, the several inductors 44 for each of the sections 30 and 32 of the stator primarily determine the operating frequencies and the antenna input tap position for the channels (2 to 6) in the lower VHF band (54 to 88 mc.) and the conductive rotor element 34 on section 30 substantially determines the operating frequencies for the channels (7 to 13) in the upper VHF band (174 to 216 mc.) The manner of accomplishing this result can be shown by further consideration of Figure 1.

The rotor element 36 is split into two segments which are mechanically arranged for simultaneous rotation but electrically insulated from each other, and the rotor element 34 is divided in a radial direction such that a complete electric conducting path may not extend around the entire surface of this element. An electrical pin connection 46 is provided between the rotor element 34 and one section of the rotor element 36. The switch elements thus arranged, in combination with the input and stray capacitance of the R.-F. amplifying tube 22 provide a bandpass filter circuit for signal currents which flow therethrough.

To permit the coupling of input signals between the grid 50 and the cathode 52 of the R.-F. amplifying tube 22, the terminal 2 of the switch section 32 is connected to the chassis or system ground through a tuning inductor 54. The cathode 52 is grounded through a biasing resistor 56 in a well known manner. A by-pass capacitor 58 provides a low impedance path to ground for radio frequency signals.

Further in accordance with the invention, the inductance of the rotor element 34 is controlled by changing the length of the electrical conducting path through the element. This is accomplished in the example illustrated by including a series of narrow radial slots 60 and 62 alternately along the outside and inside circumference respectively of the rotor 34, the slots 62 having enlarged circular bottom, or inner, ends. Although the particular geometrical configuration of the slots illustrated is preferred for manufacturing expediencies, these configurations should not be considered exclusive. Any suitable alternately radially slotted configuration may be used if the electrical length of the rotor element is maintained at a desired value, depending on the particular band of operating frequencies in which signals are to be received.

In the embodiment of the invention illustrated in Figure 1, the rotary switch 20 is shown in a position of adjustment for receiving signals in channel 2. In this position of the switch, electrical connection is made through the slotted portion of the rotor element 34 and each of the inductors 44 of switch section 30 to the grid 50 of tube 22, and through a portion of the rotor element 36 and each of the inductors 44 of switch section 32 to ground. Thus all the inductors 44 as well as the inductance of the rotor 34 are switched into circuit at this lowest operating frequency. Since, however, the inductance of the rotor 34 is relatively small its effect on the tuning of the system will not be appreciable as compared to the effect of each of the inductors 44.

As successively higher channels are selected by turning the control knob 38 in a counter clockwise direction, movement of the rotor element 34 will eliminate one inductor for each higher channel selected. In a like manner the rotor element 36 will successively eliminate one inductor for each higher channel selected. It is in this manner that the proper impedance matching condition between the amplifier 22 and the antenna may be attained. The successive elimination of inductors continues through the lower VHF band of frequencies representing channels 2 to 6.

At channel 7 all the inductors 44 are removed from the circuit by the shorting action of the respective rotors 34 and 36. It is at this point that the inductance of the rotor 34 is used as the main frequency determining element of the switching system. As was previously explained the inductance of the rotor 34 can be controlled in any desired manner by effectively changing the length of its electrical conducting path. It is in this manner that the slots in part determine the inductance of the rotor.

As successively higher channels are selected in the upper VHF band, smaller portions of the rotor 34 are effectively in circuit between the network 18 and the amplifying tube 22, until channel 13 is selected, at which point there is a minimum of inductance. Thus it is apparent that if the reception of only channels 7 to 13 is desired, all the inductors 44 may be eliminated and all the contacts with the exception of 48*a*, 48*b* and 48*c* may also be eliminated. The inductor 54 may be adjustable for alignment purposes.

The system illustrated in Figure 1 operates in accordance with conventional superheterodyne principles. Thus signals picked up by the antenna 16 are filtered in the network 18 which rejects all signals in the range just below the lowest channel frequency desired. In the case of television reception, the network 18 may have a cut-off frequency just below 54 mc. Signals from the network 18 pass through the rotary switch system 20 which conveys signals in the band of frequencies for the particular channel selected to the R.-F. amplifying tube 22, as was hereinbefore described. The amplified signals may then be taken from the plate 64 of the amplifying tube 22 and applied to an additional R.-F. amplifier stage 24 if desired. The amplified signals are mixed with the signals from a local oscillator 28 in a mixer 26 to produce an intermediate frequency (I.-F.) signal. The I.-F. signal is then passed to the first I.-F. stage of the receiver (not shown).

As shown in Figure 1 the switch 20 may be gang-connected as indicated by the dotted connection line 66 for unitary operation with additional frequency-determining rotary switches (not shown) through the common shaft 40. Thus, for example, a rotary switch may be used to tune the output frequency of the R.-F. amplifier 24 and additional rotary switches may be used to tune the input frequency of the mixer 26 and the frequency of operation of the local oscillator 28. Accordingly, all stages may be tuned by single control knob 38.

The features of the improved switch 20 are shown in more detail in Figures 2, 3 and 4, reference to which is now made. The switch rotor element 34 provides inductance for the upper band of VHF frequencies. A series of circumferential terminals (2 to 13) surround the rotor 34 in a manner similar to that illustrated in Figure 1. Fixed contacts 48, integral with the terminals are attached to the stator 42 in any suitable manner for selective engagement with the rotor element. Serially connected between certain of these contacts are coils or tuning inductance elements 44 having a predetermined number of turns in accordance with the inductance value needed for the particular range of operating frequencies. The coil 44*a* has a conductive core 72 which may be screw-driver adjusted for alignment purposes. The insulated stator 42 may have two projecting tabs 68 for supporting engagement with the walls of the tuner housing.

The improved switch portion or section in which the rotor element 36 is located is shown more fully in Figure 3. This is similar to the rotor 34 in location and operation having a series of conventional terminals (2 to 13) and a plurality of fixed contacts 48. As shown in Figure 2, the tuning inductors 44 are illustrated as being spirally wound coils of one or more turns which are connected in series between the contacts (2 to 13). This may be accomplished for example by soldering the coils between the contacts.

As an aid in manufacturing this tuning means, the rotor elements 36 and 34 are joined for unitary rotation by two insulating portions 74 and 74*a* to which the rotors 36 and 34 respectively are attached as indicated in Figure 4. The rotor and stator elements may be assembled into a unit in any one of several ways, as is obvious. The cross sectional view in Figure 4 is taken through the electrical connection 46 between the two rotor elements, which is a pin-through connection in actual construction as indicated.

An improved high frequency rotary switch tuning means for tuning high frequency signal receiving systems, constructed in accordance with the present invention provides an economical and reliable means for accurately tuning such systems over a wide band of received signals.

Although the present invention has been illustrated and described in connection with a tuning system for television receivers or the like, and is particularly well adapted for such an application, it is not limited thereto.

What is claimed is:

1. In a high frequency signal receiving system for multiple frequency band operation, the combination with tunable signal mixer and amplifier means having a common tuning control shaft, of a signal input circuit for said system, rotary switch tuning means connected in said circuit for operation through said control shaft and providing predetermined signal selection in a plurality of signal channels, said tuning means comprising a pair of conductive annular rotor elements connected with and rotatable by said shaft in unison, a first of said rotor elements being alternately slotted radially on portions of its inner and outer peripheries to provide a tortuous inductive tuning element effective to tune said system for selective signal response in one signal band, a second of said rotor elements being segmented and having a contact element connected with one of the segments, said tuning means further comprising a stator element having a plurality of terminals arranged in an annular ring surrounding said rotor elements and insulated therefrom and having a first series of inductive tuning coils connected along and with a first set of said terminals and a second series of inductive tuning coils connected with and along a second set of said terminals effective to tune said system for selective signal response in another frequency band.

2. In a high frequency signal receiving system for multiple frequency band operation, the combination as defined in claim 1, wherein signal input contact means is provided on said stator element in engagement with the first rotor element, together with means providing a signal output connection at one end terminal of said first series of tuning coils, means including a contact carried by the stator element providing a connection between the opposite end terminal of said first series of tuning coils and the first rotor element, means providing a contact on said stator element connected with the second of said series of said tuning coils at one end terminal thereof, a fourth contact carried by said stator element in engagement with said second rotor element and connected to a point of reference potential, a tuning inductor in said connection, means providing a connection from one segment of said second rotor element with the first rotor element, and a series of contacts carried by said stator element and connected with said series of tuning coil terminals for selective engagement with the slotted portion of said first rotor element and the contact of said rotor element in unison in response to rotation of said control shaft, thereby to tune said input circuit through one frequency band by inductive change in the first rotor element and through the second frequency band by insertion of said tuning coils in said circuit selectively.

3. A system as defined in claim 1 wherein said first rotor element comprises a flat annular conductive strip slotted through at one point to provide circuit discontinuity.

4. In a signal receiving system adapted for operation within separated radio frequency bands and comprising at least a signal input circuit and signal amplifying means, rotary switch tuning means connected with said input circuit and said amplifying means, said switch means comprising at least a stator element and a first and a second rotor element, said first rotor element providing substantially the sole frequency determining inductance between said input circuit and said amplifying means over one of said frequency bands, means for varying the inductance of said first rotor element, means providing an electrical connection between said first and second rotor elements, and a plurality of impedance elements and contacts carried by the stator element adapted for selective electrical connection with said rotor elements to change the tuning response between said input circuit and said amplifying means in another of said bands whereby said system is selectively responsive to predetermined frequencies within each of said frequency bands.

5. A system as defined in claim 4, wherein said first rotor element has a series of predetermined alternate radial slots to provide a tortuous inductive tuning element effective to tune said system in said one of said frequency bands.

6. In a television signal receiver operative in a plurality of signal channels and having a signal input circuit; rotary switch tuning means connected in said signal input circuit comprising a first annular conductive rotor element having a predetermined amount of inductance defined by a series of spaced radial slots therein, a second annular rotor element comprising a first and a second semi-circular segment, an annular insulating stator member having a series of terminals and contacts angularly spaced along said member, means including a contact on said stator element connecting one of said first and second segments to a source of fixed potential, means axially mounting said first and second rotor element on opposite sides of said stator member for joint rotation in the same direction and in selective electrical connection with said contacts, a plurality of tuning inductance elements serially connected to and along certain of said terminals and contacts, means providing a signal output connection for said tuning means at one end of said series of inductance elements, means electrically connecting said first rotor element with one of said segments, contact means carried by the stator element electrically connecting said first rotor element with said input circuit, and means for simultaneously moving said rotor elements for electrical engagement with certain of said contacts whereby said system is selectively tuned to preselected ones of said signal channels.

7. In a television signal receiver operative in a plurality of signal channels; rotary switch tuning means for signal channel selection comprising a first annular rotor element having a predetermined amount of inductance defined by a series of predetermined radial slots therein, a second annular rotor element comprising a pair of substantially semi-circular segments, a stationary support member having an opening therein, means mounting said first and second rotor element on opposite sides of said support member for simultaneous rotation in the same direction, a plurality of circumferentially spaced tuning coils mounted on opposite sides of said support member, a plurality of spaced contacts carried by said insulating member and connected to certain of said coils, means electrically connecting said first rotor element with one of said segments, and means for simultaneously rotating said rotor elements for electrical connection with certain of said coils whereby said system is selectively tuned to preselected ones of said signal channels.

8. A system a defined in claim 7 wherein said support member is an insulator and said rotor elements are supported on opposite sides of said support member in back-to-back relation.

9. In a signal receiving system for operation within separated radio frequency bands and comprising at least a signal input circuit and signal amplifying means; rotary switch tuning means connected with said input circuit and said amplifying means, said switch means comprising an insulated stator element and a first and a second conductive rotor element, said first rotor element having a radially-slotted conductive surface providing substantially the sole frequency determining inductance between said input circuit and said amplifying means over one of said frequency bands, means for varying the effective inductance of said element, means for simultaneously rotating said first and second rotor element in a predetermined relation, means providing a conductive connection between predetermined points on said first and second rotor elements, and a plurality of impedance elements adapted for selective electrical connection with said rotor elements and between said input circuit and said amplifying means whereby said system is selectively responsive to predetermined frequencies within another of said frequency bands.

10. In a television signal receiver operative within a plurality of frequency channels; a signal input circuit for said system, rotary switch tuning means coupling said receiver to said signal input circuit comprising a first annular rotor element having a predetermined amount of inductance defined by a series of predetermined radial slots therein, a second annular rotor element comprising a pair of substantially semi-circular segments, an insulating stator element having an opening therein, means mounting said first and second rotor element on opposite sides of said stator element for simultaneous rotation in the same direction, a plurality of circumferentially spaced terminals mounted on opposite sides of said insulating member, a plurality of tuning coils connected along and with certain of said terminals, a plurality of contacts supported by said stator element and connected to certain of said terminals, means electrically connecting said first rotor element with one of said segments, means electrically connecting one of said terminals to the corresponding terminal on the opposite side of said stator element, and means for simultaneously rotating said rotor elements for electrical engagement with certain of said contacts thereby to tune said input circuit through one frequency band by inductive change in the first rotor element and through a second frequency band by insertion of said tuning coils in said circuit selectively.

11. In a television signal receiver operative within a plurality of frequency channels, a signal input circuit for said system, rotary switch tuning means coupling said receiver to said signal input circuit comprising a first conductive rotor element having alternate radial slots to provide an inductive tuning element effective to tune said receiver to certain of said channels, a second rotor element comprising a pair of conductive segments, an insulated stator element having a plurality of circumferentially spaced terminals corresponding to said frequency channels surrounding said rotor elements and insulated therefrom, inductive tuning elements connected between certain of said terminals, means providing a conductive connection between said first rotor element and one of said segments, and control means for rotating said rotor elements in unison for selective electrical engagement with certain of said terminals whereby said system provides predetermined signal selection in said frequency channels.

12. In a high frequency signal receiving system for multiple frequency band operation, the combination with tunable signal mixer and amplifier means, of a tunable signal input circuit for said system having a signal input connection, a signal output connection and a connection with a point of reference potential, said circuit including rotary switch tuning means connected in said input circuit providing predetermined signal selection in a plurality of signal channels, said tuning means comprising a pair of rotor elements rotatable in unison, a first of said rotor elements providing an inductive tuning element effective to tune said circuit for signal response in one frequency band, a second of said rotor elements being segmented and having a contact element connected with one of the segments, said tuning means further comprising a stator element having a plurality of terminals surrounding said rotor elements and insulated therefrom with a first series of tuning coils connected along and with a first set of said terminals and a second series of tuning coils connected with and along a second set of said terminals effective to tune said system for signal response in another frequency band and providing impedance matching for said system.

13. A high frequency tuner for operation within the separated radio frequency bands comprising in combination, rotary switch tuning means having an insulating stator element and a conductive rotor element, external circuit connection terminals for said tuner, a plurality of switching contacts mounted on said stator element, a plurality of inductors for tuning in a first of said radio frequency bands connected between certain of said switching contacts, means including said rotor for cooperation with said switching contacts to connect predetermined ones of said inductors with said external circuit connection terminals, said rotor element providing a tortuous conductive path having an inductance effective for tuning in a second of said radio frequency bands, and means including certain of said switch contacts for connecting predetermined portions of said rotor element with said external connection terminals.

References Cited in the file of this patent

UNITED STATES PATENTS

| | | |
|---|---|---|
| 2,497,747 | Valdettaro | Feb. 14, 1950 |
| 2,511,673 | Lawrence | June 13, 1950 |
| 2,535,686 | Lawrence | Dec. 26, 1950 |
| 2,551,228 | Achenbach | May 1, 1951 |
| 2,584,120 | Fyler | Feb. 5, 1952 |
| 2,584,176 | Wingert | Feb. 5, 1952 |
| 2,627,579 | Wasmansdorff | Feb. 3, 1953 |
| 2,657,365 | Lazzery | Oct. 27, 1953 |